United States Patent
Zhou

(10) Patent No.: US 9,985,037 B2
(45) Date of Patent: May 29, 2018

(54) METHOD AND STRUCTURE FOR FINFET SRAM

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days. days.

(21) Appl. No.: 15/384,194

(22) Filed: Dec. 19, 2016

(65) Prior Publication Data

US 2017/0221908 A1  Aug. 3, 2017

(30) Foreign Application Priority Data

Feb. 2, 2016  (CN) .......................... 2016 1 0073020

(51) Int. Cl.
*H01L 27/11*  (2006.01)
*H01L 21/8238*  (2006.01)
(Continued)

(52) U.S. Cl.
CPC .... *H01L 27/1104* (2013.01); *H01L 21/02271* (2013.01); *H01L 21/2254* (2013.01);
(Continued)

(58) Field of Classification Search
CPC ....... H01L 2924/00; H01L 2224/32225; H01L 2224/48227; H01L 29/66795;
(Continued)

(56) References Cited

U.S. PATENT DOCUMENTS

| 2007/0026615 A1 | 2/2007 | Goktepeli et al. |
| 2014/0319543 A1 | 10/2014 | Yin et al. |
| 2015/0255609 A1 | 9/2015 | Zhu et al. |

FOREIGN PATENT DOCUMENTS

CN    105097527    11/2015

OTHER PUBLICATIONS

European Application No. 17153086.8, Extended European Search Report dated Jun. 6, 2017, 10 pages.

*Primary Examiner* — Tony Tran
(74) *Attorney, Agent, or Firm* — Kilpatrick Townsend & Stockton LLP

(57) ABSTRACT

A method for forming a semiconductor device includes providing a substrate structure having a plurality of semiconductor fins disposed on a substrate and a hard mask layer on the semiconductor fins. A first insulating material layer is formed covering the semiconductor fins, the hard masks, and the spaces between the semiconductor fins. Next, a first etch back process is performed to remove a top portion of the first insulating material layer to expose a portion of each of the semiconductor fins. Then dopants are implanted into remaining portions of the first insulating material layer and diffused into the semiconductor fins to form impurity regions. Next, a second etch back process is performed to remove a top portion of the remaining first insulating material layer to remove the implanted dopants in the first insulating material layer. Thereafter, a second insulating material layer is formed overlying the remaining first insulating material layer.

11 Claims, 7 Drawing Sheets

(51) Int. Cl.
  *H01L 21/308*    (2006.01)
  *H01L 21/311*    (2006.01)
  *H01L 21/3115*   (2006.01)
  *H01L 21/225*    (2006.01)
  *H01L 29/167*    (2006.01)
  *H01L 21/3105*   (2006.01)
  *H01L 21/02*     (2006.01)

(52) U.S. Cl.
  CPC .... *H01L 21/3081* (2013.01); *H01L 21/31053* (2013.01); *H01L 21/31111* (2013.01); *H01L 21/31155* (2013.01); *H01L 21/823814* (2013.01); *H01L 21/823821* (2013.01); *H01L 21/823892* (2013.01); *H01L 29/167* (2013.01)

(58) Field of Classification Search
  CPC ......... H01L 2224/73265; H01L 29/785; H01L 21/823821; H01L 29/66545; H01L 27/0924
  See application file for complete search history.

METHOD AND STRUCTURE FOR FINFET SRAM

CROSS-REFERENCES TO RELATED APPLICATIONS

This application claims priority to Chinese patent application No. 20160073020.0, filed on Feb. 2, 2016, the content of which is incorporated herein by reference in its entirety.

BACKGROUND OF THE INVENTION

The present invention relates to semiconductor technologies, and more particularly to methods for the fabrication of semiconductor devices.

As the critical dimensions shrink in metal oxide semiconductor field effect transistor (MOSFET), the short channel effect (SCE) has become a critical issue. FinFET (Fin Field Effect Transistor) has good gate control capability to effectively suppress the short channel effect. Therefore, FinFET devices are often used in the design of small semiconductor devices.

However, due to the reduced size, the device is prone to punch-through effect. In order to suppress the punch-through effect, a channel stop ion implantation is often carried out in the bottom of the fin. However, for N-type metal oxide semiconductor (NMOS) devices, channel stop impurity ions can easily spread during annealing, resulting in loss of well implanted ions. Therefore, a greater ion implantation dose in channel stop ion implantation is often required in the NMOS devices.

However, the inventors have found that, after annealing, the greater implantation dose can cause the implanted ions to diffuse into the P-type metal oxide semiconductor (PMOS) device, so that the N-type fin becomes P type, thus affecting the performance of the device. The problem is particularly severe in small fins in SRAM (Static Random Access Memory), in which N-type and P-type FinFET devices are disposed adjacent to each other.

BRIEF SUMMARY OF THE INVENTION

Embodiments of the present invention provide a method for forming channel stop regions in a FinFET device in which N-type and P-type devices are disposed adjacent to each other. In order to reduce undesired lateral diffusion of dopant ions, after channel stop implant and diffusion to form channel stop regions in the fin structures, the top portion of the insulating layer is etched back to remove dopant ions in the insulating layer. As a result, lateral diffusion of dopant ions is reduced or eliminated during subsequent annealing or thermal steps.

According to some embodiments of the present invention, a method for forming a semiconductor device includes providing a substrate structure, which has a substrate, a plurality of semiconductor fins disposed on the substrate, and a hard mask layer disposed on each of the semiconductor fins. A first insulating material layer is formed covering the plurality of semiconductor fins, the hard masks, and spaces between the semiconductor fins. Next, a first etch back process is performed to remove a top portion of the first insulating material layer to expose a portion of each of the semiconductor fins. Then, dopants are implanted into remaining portions of the first insulating material layer and diffused into the semiconductor fins to form impurity regions. The method also includes performing a second etch back process to remove a top portion of the remaining first insulating material layer to remove the implanted dopants in the first insulating material layer, and forming a second insulating material layer overlying the remaining first insulating material layer.

In an embodiment of the method, the substrate includes a P-well and an N-well, and the plurality of semiconductor fins includes a first set of fins overlying the P-well and configured for N-channel devices and a second set of fins disposed overlying the N-well and configured for P-channel devices.

In an embodiment of the method, forming impurity regions in each of the plurality of semiconductor fins includes implanting P-type dopants into the remaining portions of the first insulating material layer adjacent to the first set of fins overlying the P-well and causing diffusion of the P-type dopants to form first impurity regions in the first set of fins overlying the P-well, and implanting N-type dopants into the remaining portions of the first insulating material layer adjacent to the second set of fins overlying the N-well and overlying the N-well causing diffusion of the N-type dopants to form second impurity regions in the second set of fins.

In an embodiment of the method, the P-type dopants include boron ions or BF2 ions, and the N-type dopants include Arsenic ions.

In an embodiment of the method, the dopant concentration in the first impurity regions are higher than the dopant concentration in the P-well; and the dopant concentration in the second impurity regions is higher than the dopant concentration in the N-well.

In an embodiment of the method, forming a second insulating material layer includes forming a second insulating material layer overlying the plurality of semiconductor fins, the hard mask layers, and the remaining portions of the first insulating material layer. The method also includes planarizing the second insulating material layer such that the top surface of the second insulating material layer is substantially aligned with the hard mask layers, and etching the second insulating material layer to remove the implanted dopants in the first insulating material layer.

In an embodiment of the method, after performing a second etch back process, the top surface of the remaining first insulating material layer is lower than the lower surface of the impurity regions.

In an embodiment of the method, the top surface of the second insulating material layer is higher than the top surface of the impurity regions.

In an embodiment of the method, providing a substrate structure includes providing an initial substrate that includes an initial semiconductor layer, forming a patterned hard mask layer on the semiconductor layer, etching the initial semiconductor layer using the patterned hard mask as an etch mask to form the plurality of semiconductor fins, and depositing a first layer of insulating material to fill the spaces between the semiconductor fins and to cover each individual semiconductor fin, thereby forming the substrate structure.

In an embodiment, the method also includes an annealing process to activate the dopants in the impurity regions.

In an embodiment of the method, the first insulating material layer is formed by Flowable Chemical Vapour Deposition (FCV), and the second insulating material layer is formed by a high aspect ratio process (HARP) technology.

The following description, together with the accompanying drawings, will provide further understanding of the nature and advantages of the claimed invention.

DETAILED DESCRIPTION OF THE INVENTION

Figure 1:
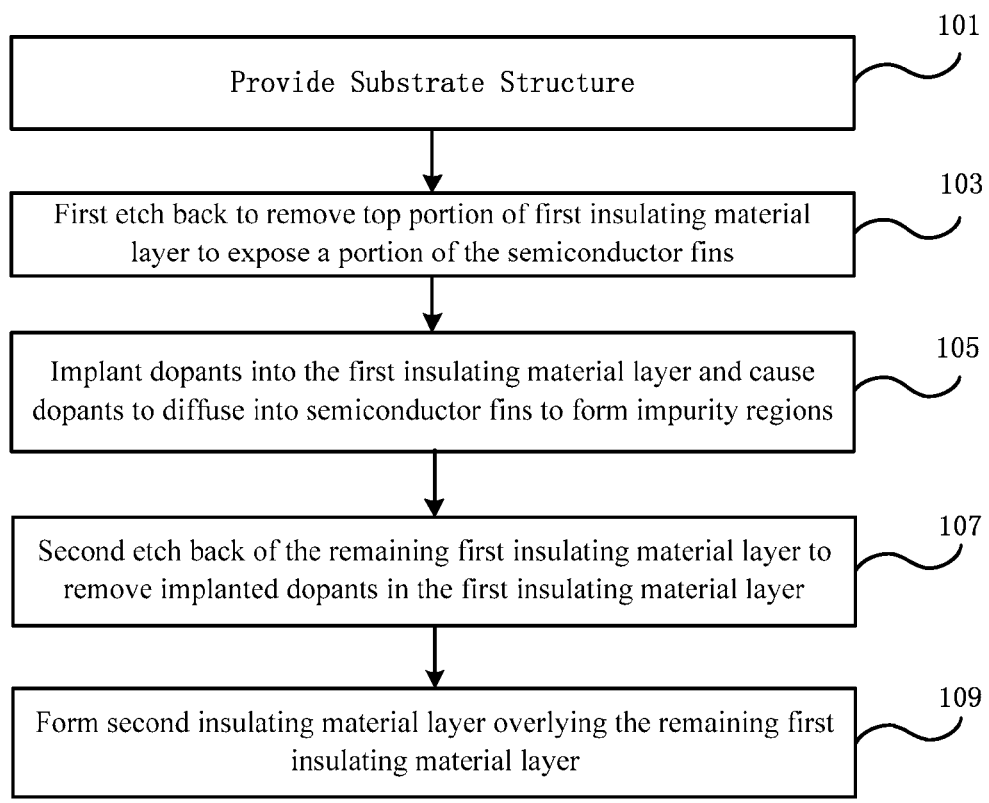
FIG. 1 is a simplified flow chart illustrating a method of manufacturing a semiconductor device according to an embodiment of the present invention.

The description below makes reference to a series of drawing figures enumerated above. These diagrams are merely examples, and should not unduly limit the scope of the claims herein. In connection with the various aspects illustrated and described, one of ordinary skill in the art would recognize other variations, modifications, and alternatives.

Embodiments of the present invention are related to the semiconductor device manufacturing method that may be used in the manufacture of semiconductor devices including FinFET semiconductor devices. Some embodiments of the present invention are directed to the process of forming channel stop regions in FinFET devices in SRAM.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Therefore, if an element has been described in connection with a figure, it will not be described in detail in subsequent figures. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations, as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms, or spatial relationship terms, such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc., do not denote any order, but rather the terms first, second, etc., are used to distinguish one element from another. Furthermore, the use of the terms a, an, etc., does not denote a limitation of quantity, but rather denote the presence of at least one of the referenced items.

The term "vertical" as used in this application is defined as a plane perpendicular to the conventional plane or surface of a wafer or substrate, regardless of the orientation of the wafer or substrate. The term "horizontal" refers to a direction perpendicular to the vertical as defined above.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein, but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Figure 2:
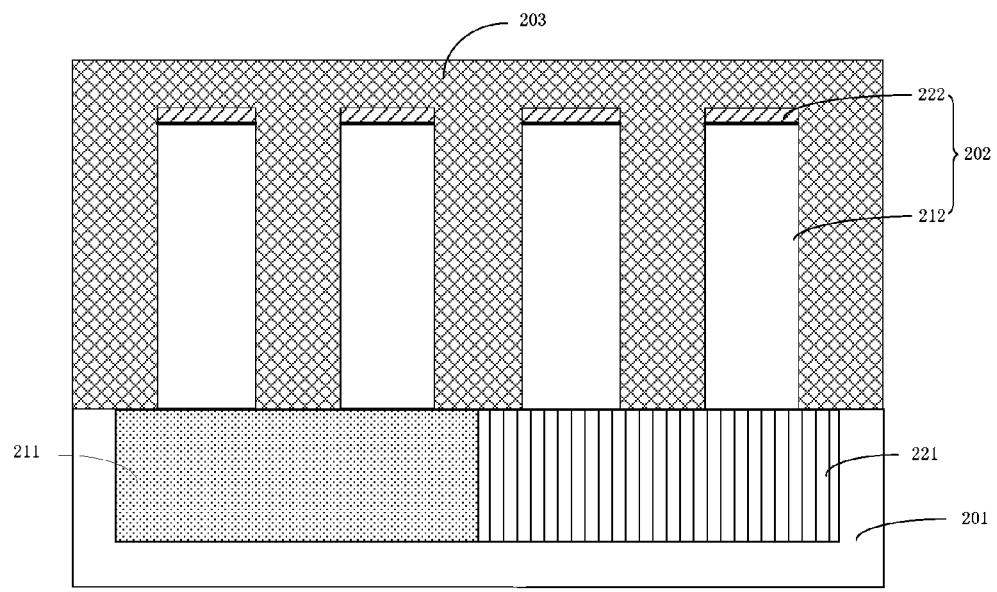
FIG. 2 is a cross-sectional view illustrating a substrate structure according to an embodiment of the present invention.

FIG. 1 is a simplified flow chart illustrating a method of manufacturing a semiconductor device according to an embodiment of the present invention. As shown in FIG. 1, in step 101, a substrate structure is formed. FIG. 2 is a cross-sectional view illustrating a substrate structure according to an embodiment of the present invention. As shown in FIG. 2, the substrate structure includes a substrate 201. In an embodiment, substrate 201 has a P-well 211 and an N-well 221. The substrate structure further includes a plurality of fin structures 202 overlying substrate 201. Each fin structure includes hard mask layer 222 overlying a semiconductor fin 212. The plurality of fin structures 202 may include a first set of semiconductor fins over P-well 211 that is configured for N-channel devices, and a second set of semiconductor fins over N-well 221 that is configured for P-channel devices. The substrate structure further includes a first insulating material layer 203 covering each fin 202 structure and filling the space between fin structures.

Figure 3A:
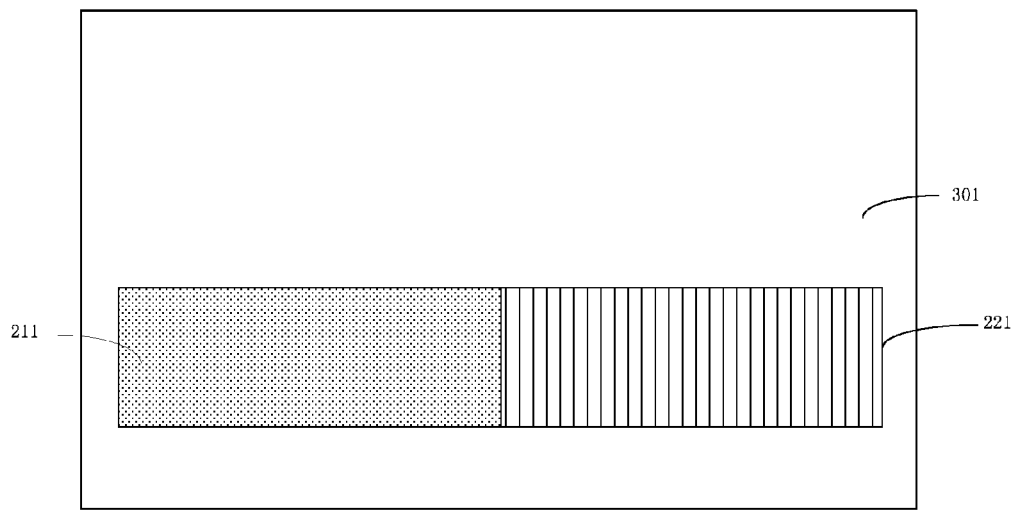
FIGS. 3A-3C are cross-sectional views illustrating a process of forming the substrate structure of FIG. 2 according to an embodiment of the present invention.
Figure 3B:
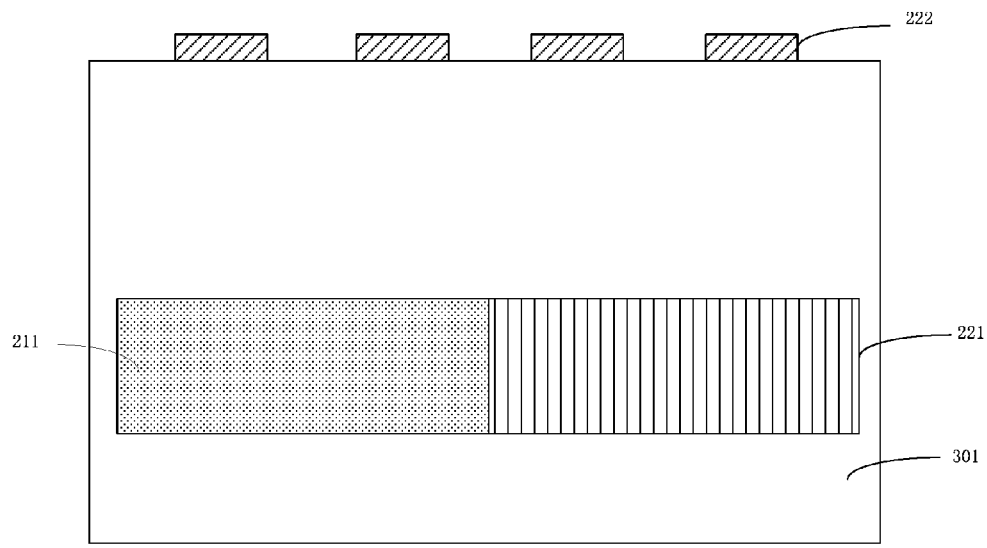
Figure 3C:
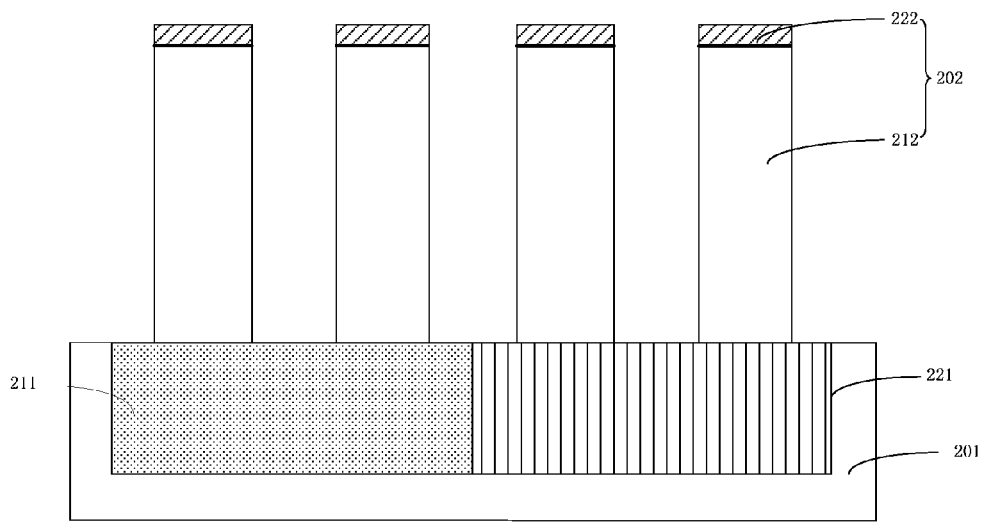

FIGS. 3A-3C are cross-sectional views illustrating a process of forming the substrate structure of FIG. 2 according to an embodiment of the present invention. In FIG. 3A, an initial substrate is provided and includes initial semiconductor layer 301. Initial semiconductor layer 301 may be, for example, silicon (Si) layer, germanium (Ge) layer, or semiconductor layer of other elements, or gallium arsenide (GaAs), and other compound semiconductor layer. However, the present invention is not limited to these examples. Ion implantation may be used to form P-well 211 and N-well 221 in initial semiconductor layer 301. For example, an N-well 221 can be formed first, and then after the fins are formed, P-well 211 can then be formed.

In FIG. 3B, a patterned a hard mask layer 222 is formed on the semiconductor layer 301. Hard mask layer 222 may be, for example, silicon nitride, silicon oxide, silicon oxynitride, and the like.

As shown in FIG. 3C, semiconductor layer 301 is etched, using the patterned hard mask 222 as an etch mask, to form a plurality of fin structures 202 on substrate 201. Thereafter, a first insulating material layer 203 is deposited to fill the space between the respective fin structures 202 cover the respective fins, thereby forming the substrate structure shown in FIG. 2. For example, first insulating material layer 203 can be a dielectric material layer and can be formed by chemical vapor deposition, such as Flowable Chemical Vapour Deposition (FCVD), to fill each space between the fins and cover each fin. In addition, a planarization process may be performed after the deposition of a first insulating material layer 203. Alternatively, a buffer layer (e.g., a silicon oxide layer is formed by thermal oxidation, not shown) may be formed on the surface of the semiconductor fins 212 before first insulating material layer 203 is deposited. The buffer layer can be used in order to repair surface damages caused by etching the fins. The buffer layer may be removed following the first isolation material layer etched back process. It should be understood that the substrate structure may be formed above according to other conventional methods, which are not discussed here.

Figure 4:
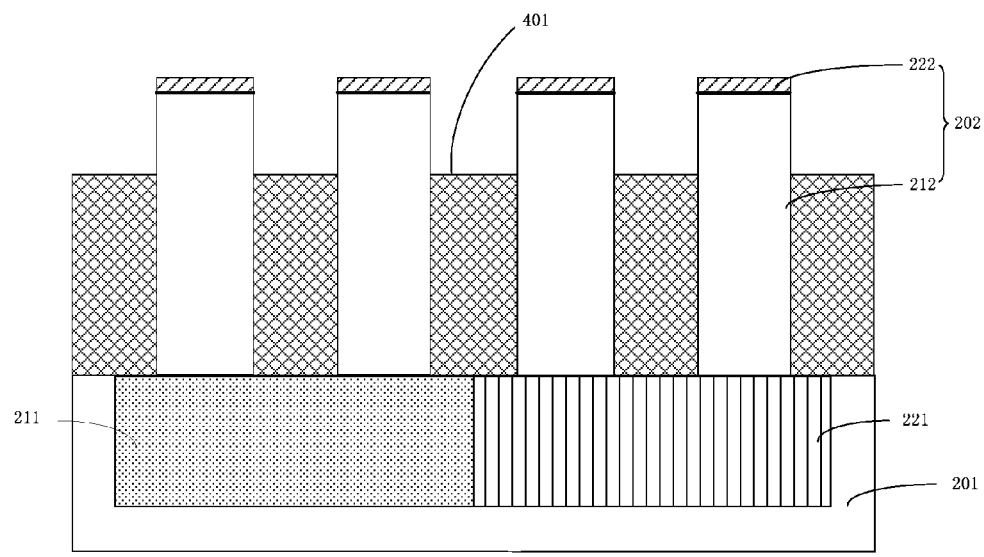
FIG. 4 is a cross-sectional view illustrating a process of forming the substrate structure of FIG. 2 according to an embodiment of the present invention.
Figure 5:
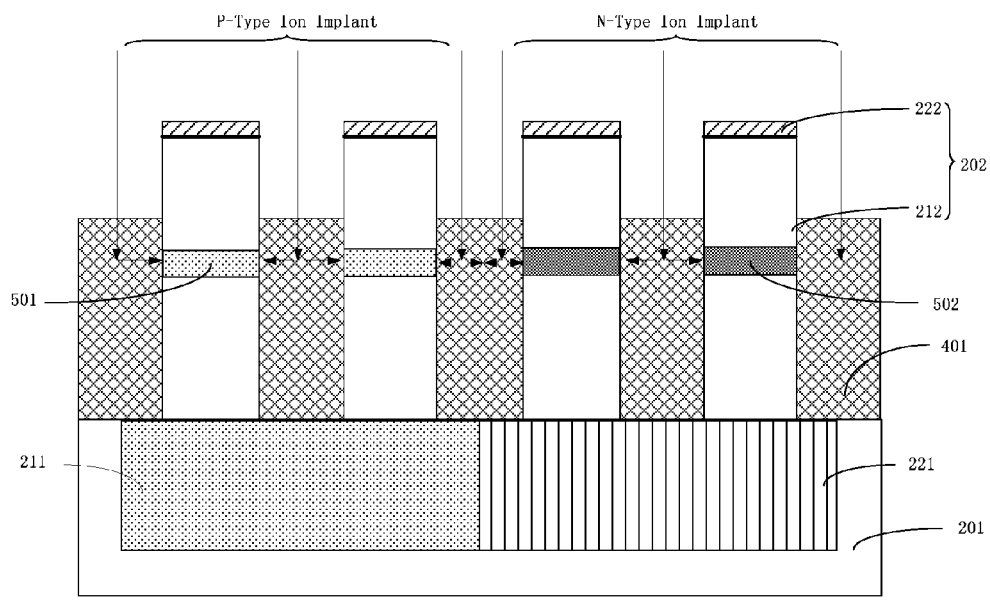
FIG. 5 is a cross-sectional view illustrating a process of forming a semiconductor device according to an embodiment of the present invention.

Returning to FIG. 1, in step 103, as shown in FIG. 4, a first etch back process is performed to remove top portions of first insulating material layer 203 to expose a portion of the semiconductor fins 212. The remaining portion of the first insulating material layer is now designated as 401.

In step 105, an ion implantation process is performed to implant dopants into remaining portions of the first insulating material layer 401 and causing diffusion of dopants to diffuse into the semiconductor fins to form impurity regions. P-type dopants can be implanted into the portion of first insulating material layer 401 between the first set of semiconductor fins over P-well 211. The P-type dopants can be boron ions or boron difluride ($BF_2$). The P-type dopants can diffuse laterally (lateral straggle). As a result, first impurity regions 501 are formed, which can be used as channel stop layers. Similarly, N-type dopants can be implanted into the portion of first insulating material layer 401 between the second set of semiconductor fins over N-well 221. The N-type dopants can be arsenic ions (As) or phosphorus (P). The N-type dopants can diffuse laterally (lateral straggle). As a result, second impurity regions 502 are formed, which can be used as channel stop layers.

Figure 6:
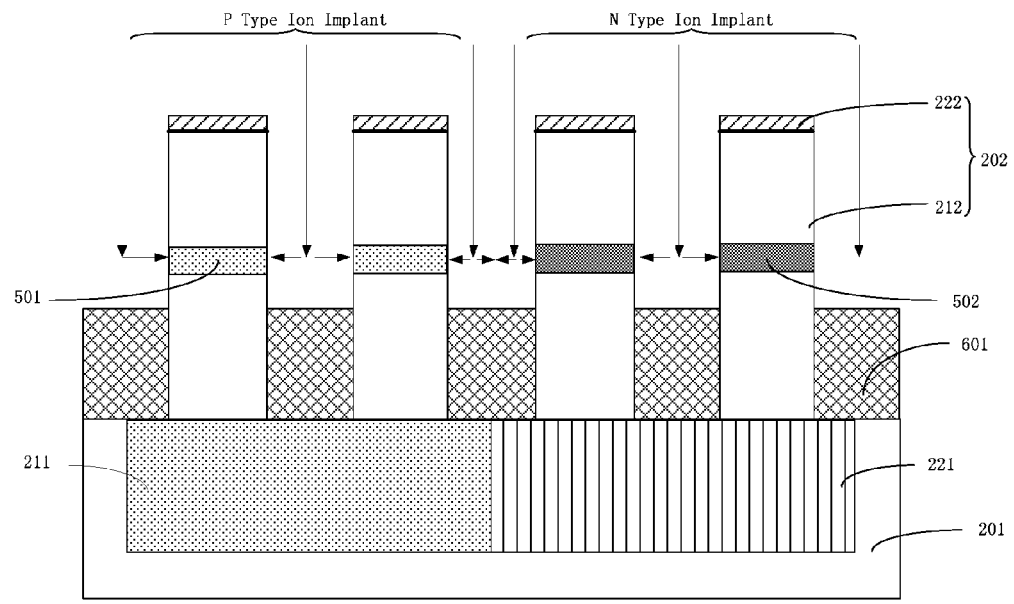
FIG. 6 is a cross-sectional view illustrating a process of forming a semiconductor device according to an embodiment of the present invention.

Continuing with FIG. 1, at step 107, a second etch back process is performed to etch away a top portion of the remaining first insulating material layer to remove the implanted dopants in the first insulating material layer. As shown in FIG. 6, portions of first insulating material layer that contain dopants are removed, and the remaining portion of first insulating material layer is now designated as 601. It can be seen that the top surface of layer 601 is lower than the lower surfaces of impurity regions 501 and 502. The remaining portions of first insulating material layer 601 will not provide dopants that may undergo lateral diffusion during subsequent thermal or annealing steps.

Figure 7:
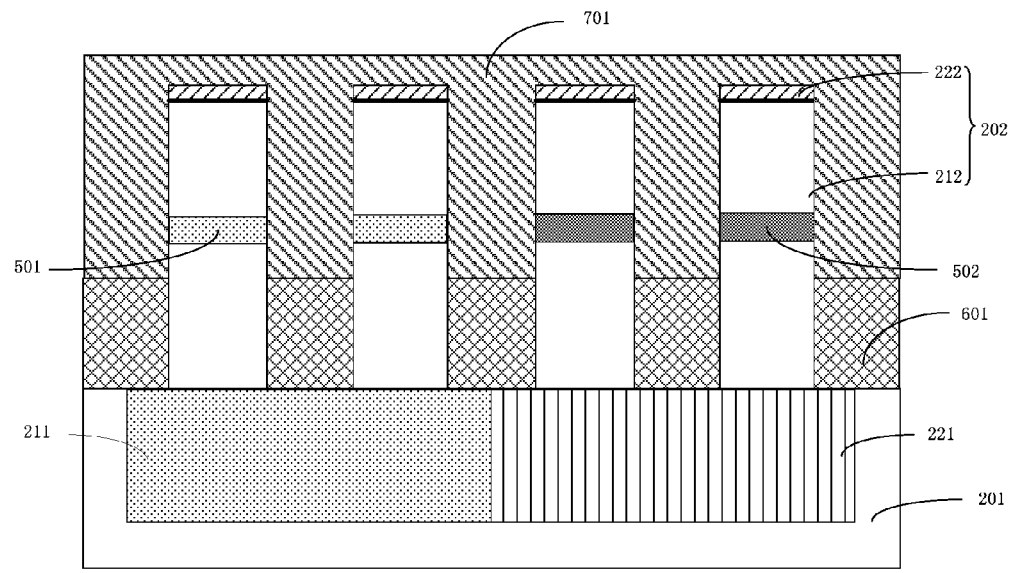
FIG. 7 is a cross-sectional view illustrating a process of forming a semiconductor device according to an embodiment of the present invention.
Figure 8:
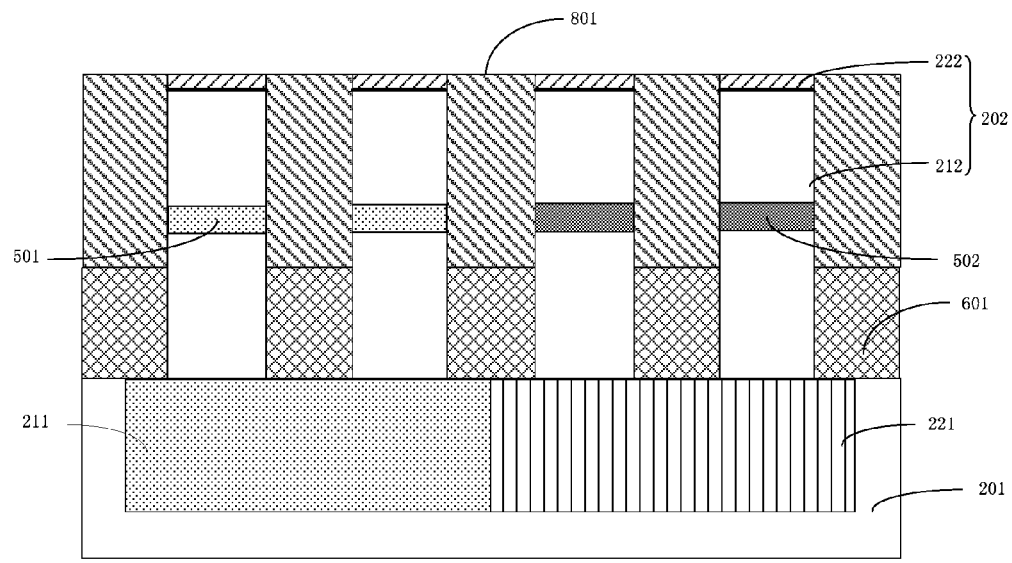
FIG. 8 is a cross-sectional view illustrating a process of forming a semiconductor device according to an embodiment of the present invention.
Figure 9:
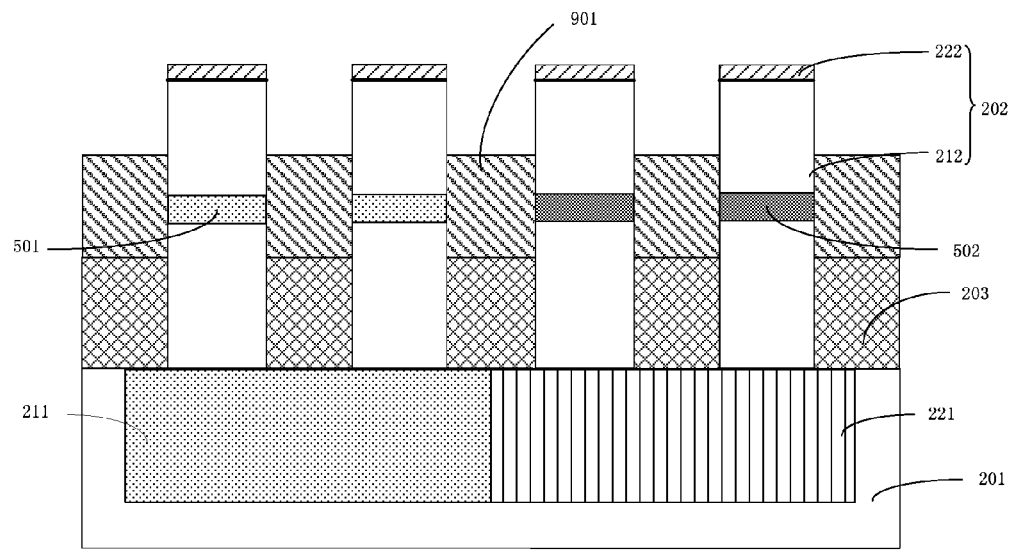
FIG. 9 is a cross-sectional view illustrating a process of forming a semiconductor device according to an embodiment of the present invention.

Continuing with FIG. 1, at step 109, as illustrated in FIGS. 7-9, the second insulating material layer is formed on the remaining first layer of insulating material.

First, as shown in FIG. 7, a second insulating material layer 701 is deposited to cover the respective fin structures 202 and the remaining first insulating material layer 601. Second insulating material 701 can be formed using a high aspect ratio process (HARP) for its superior void-filling capability and tensile stress for enhanced carrier mobilities.

Next, as shown in FIG. 8, second insulating material layer 701 is planarized, e.g., using chemical mechanical polishing (CMP), so that the top surface of the second initial isolation material layer 801 and the top surface of hard mask layer 222 are substantially at the same level.

Thereafter, as shown in FIG. 9, the remaining second insulating material layer 801 is etched back, thereby forming a second insulating material layer 901. Preferably, the top surface of second insulating material layer 901 is higher than the top surface of the impurity regions (the first impurity regions 501 and the second impurity regions 502).

Figure 10:
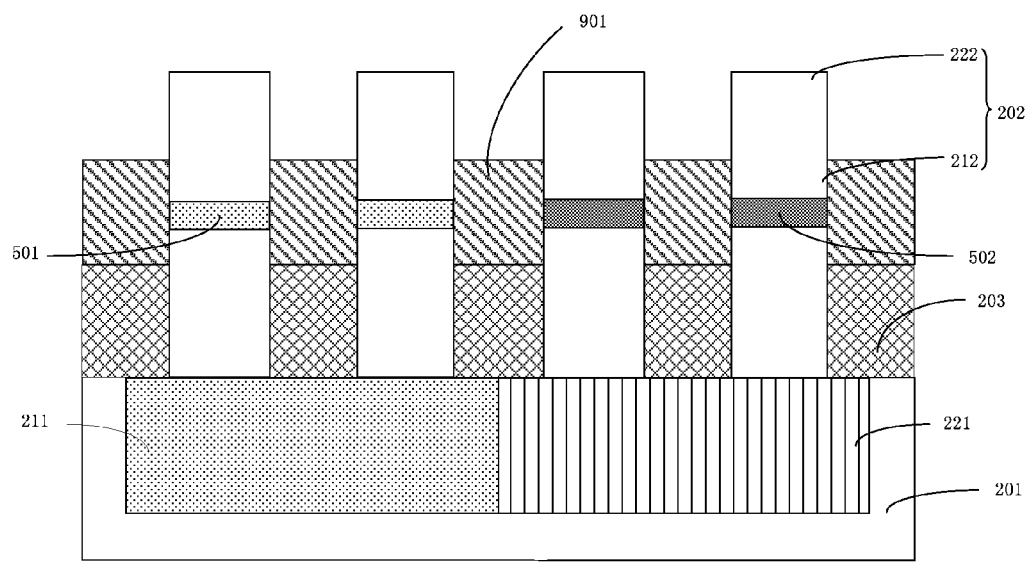
FIG. 10 is a cross-sectional view illustrating a process of forming a semiconductor device according to an embodiment of the present invention.

Next, optionally, hard mask layer 222 can be removed as shown in FIG. 10. Further, an annealing process may be performed to activate the impurities in the impurity regions.

As described above, a method of manufacturing a semiconductor device is presented. In a conventional process, for channel stop ion implantation into first insulating material layer 203, the P-type ion implantation dose is generally greater than the N-type ion implantation dose. Therefore, in a subsequent annealing process, P type ions for the first set of fins can spread to the second set of fins over the N-well 221, such that the second set of fins can be converted from N-type into P-type, which could affect performance of the PMOS device. In embodiments of the present invention, after channel stop ion implantation in the first isolation material layer, a second etch back process is carried out to remove the first layer of insulating material containing dopant ions to reduce lateral diffusion. Thereafter, a second layer of insulating material, which has not been implanted with dopants, is used to fill the gaps between the fins.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. For example, although certain composition structures and examples of materials are described, it is understood that the other materials of similar properties can also be used. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method for forming a semiconductor device, comprising:
   providing a substrate structure, the substrate structure comprising:
   a substrate,
   a plurality of semiconductor fins disposed on the substrate,
   a hard mask layer disposed on each of the semiconductor fins, and
   a first insulating material layer covering the plurality of semiconductor fins, the hard masks, and spaces between the semiconductor fins;
   performing a first etch back process to remove a top portion of the first insulating material layer to expose a portion of each of the semiconductor fins;
   implanting dopants into remaining portions of the first insulating material layer and causing dopants to diffuse into the semiconductor fins to form impurity regions having an upper surface and a lower surface;
   performing a second etch back process to remove a top portion of the remaining portions of the first insulating material layer to remove the implanted dopants in the first insulating material layer;
   forming a second insulating material layer overlying a remaining portion of the remaining portions of the first insulating material layer, the second insulating material layer having an upper surface lower than an upper surface of the semiconductor fins.

2. The method of claim 1, wherein the substrate comprises a P-well and an N-well, and the plurality of semiconductor fins comprises a first set of fins overlying the P-well and configured for N-channel devices and a second set of fins disposed overlying the N-well and configured for P-channel devices.

3. The method of claim 2, wherein forming impurity regions in each of the plurality of semiconductor fins comprises:
   implanting P-type dopants into the remaining portions of the first insulating material layer adjacent to the first set of fins overlying the P-well and causing diffusion of the P-type dopants to form first impurity regions in the first set of fins overlying the P-well; and
   implanting N-type dopants into the remaining portions of the first insulating material layer adjacent to the second set of fins overlying the N-well causing diffusion of the N-type dopants to form second impurity regions in the second set of fins.

4. The method of claim 3, wherein:
   the P-type dopants comprise boron ions or $BF_2$ ions; and
   the N-type dopants comprise Arsenic ions.

5. The method of claim 3, wherein:
   the dopant concentration in the first impurity regions is higher than the dopant concentration in the P-well; and
   the dopant concentration in the second impurity regions is higher than the dopant concentration in the N-well.

6. The method of claim 1, wherein forming a second insulating material layer comprises:
   forming a second insulating material layer overlying the plurality of semiconductor fins, the hard mask layers, and the remaining portions of the first insulating material layer;
   planarizing the second insulating material layer such that the top surface the second insulating material layer is substantially aligned with the hard mask layers; and
   etching the second insulating material layer to remove a portion of the second insulating material layer, such that an upper surface of a remaining portion of the second insulating material layer is higher than the upper surface of the impurity regions.

7. The method of claim 1, wherein, after performing a second etch back process, an upper surface of the remaining portion of the remaining first insulating material layer is lower than the lower surface of the impurity regions.

8. The method of claim 1, wherein the upper surface of the second insulating material layer is higher than the top surface of the impurity regions.

9. The method of claim 1, wherein providing a substrate structure comprises:
   providing an initial substrate that includes an initial semiconductor layer;
   forming a patterned hard mask layer on the semiconductor layer;
   etching the initial semiconductor layer using the patterned hard mask as an etch mask to form the plurality of semiconductor fins; and
   depositing a first layer of insulating material to fill the spaces between the semiconductor fins and to cover each individual semiconductor fins, thereby forming the substrate structure.

10. The method of claim 1, further comprising an annealing process to activate the dopants in the impurity regions.

11. The method of claim 1, wherein:
    the first insulating material layer is formed by Flowable Chemical Vapour Deposition (FCV); and the second insulating material layer is formed by a high aspect ratio process (HARP) technology.

* * * * *